United States Patent [19]

Linn

[11] 4,081,861
[45] Mar. 28, 1978

[54] MATRIXED MAGNETIC BUBBLE MEMORIES

[75] Inventor: John Charles Linn, Richardson, Tex.

[73] Assignee: Texas Instruments Incorporated, Dallas, Tex.

[21] Appl. No.: 548,472

[22] Filed: Feb. 10, 1975

[51] Int. Cl.² .......................................... G11C 19/08
[52] U.S. Cl. ..................................... 365/2; 365/12; 365/15
[58] Field of Search .................. 340/174 TF, 174 SR

[56] References Cited

U.S. PATENT DOCUMENTS

| | | | |
|---|---|---|---|
| 3,737,882 | 6/1973 | Furuoya | 340/174 TF |
| 3,750,154 | 7/1973 | Almasi | 340/174 TF |
| 3,751,597 | 8/1973 | Bonyhard | 340/174 TF |
| 3,792,450 | 2/1974 | Bogar et al. | 340/174 TF |
| 3,838,407 | 9/1974 | Juliussen | 340/174 TF |
| 3,944,991 | 3/1976 | Murakami | 340/174 TF |

*Primary Examiner*—James W. Moffitt
*Attorney, Agent, or Firm*—James T. Comfort; Rene E. Grossman; James J. Elacqua

[57] ABSTRACT

A magnetic bubble memory organization comprising a plurality of magnetic bubble memory chips arranged in rows and columns to form a matrix. Each chip has a plurality of memory locations for storing magnetic bubbles, selectively operable components for transferring magnetic bubbles out of and into memory locations for the retrieval and storage of information, a selectively operable replicator and annihilator of magnetic bubble information transferred out of memory locations on the chip, a generator selectively operable for producing magnetic bubbles for storage in memory locations on the chip, and a detector for sensing the presence of magnetic bubbles transferred out of memory locations and for providing an electrical output signal in response to the detection thereof. First transfer electrical control signals are respectively commonly applied to the first transfer components on all chips in each of the respective columns of the matrix for their simultaneous actuation. Similarly second transfer electrical control signals are respectively commonly applied to the second transfer components on all chips in each of the respective columns of the matrix for their simultaneous actuation. Replicate and annihilate electrical control signals are respectively commonly applied to the replicator and annihilator on all chips in each of the respective rows of the matrix for their simultaneous actuation. Generate control signals are respectively commonly applied to the generators on all chips in each of the respective rows of the matrix for their simultaneous actuation. The movement of magnetic bubbles in all chips is synchronized. A single circuit commonly connecting the detector of each chip in the matrix conveys retrieved information out of the matrix. Thus, the memory locations of any magnetic bubble memory chip in the matrix may be selectively accessed for the storage and retrieval of information with a minimum number of different control signal sources and conductors for all the chips in the matrix and only a single output circuit.

14 Claims, 4 Drawing Figures

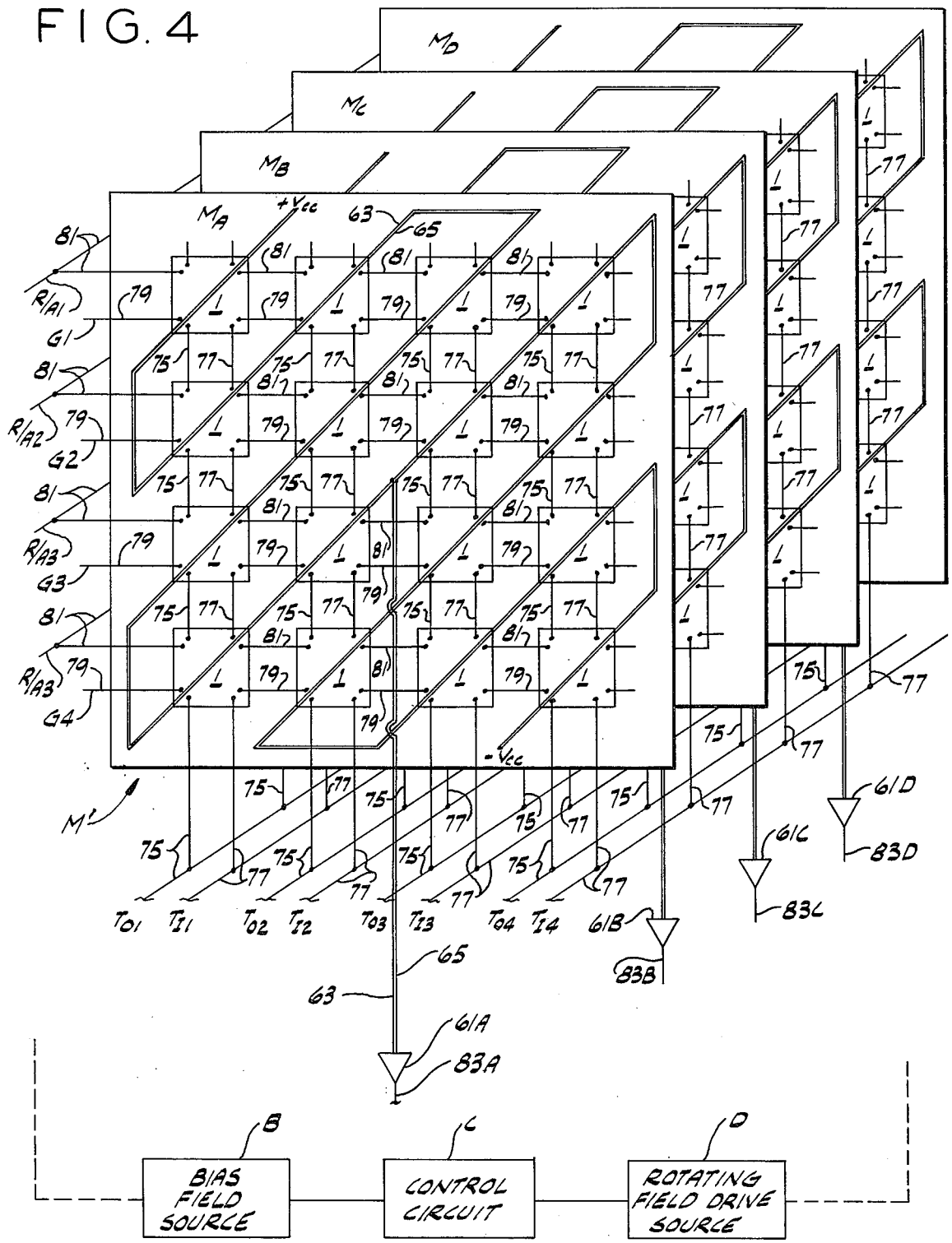

MATRIXED MAGNETIC BUBBLE MEMORIES

BACKGROUND OF THE INVENTION

This invention relates to magnetic bubble memory organizations and more particularly to matrixed memory organizations.

Magnetic bubble memories have been of growing interest because of their increased storage capacity for a given area as compared to conventional memory storage systems such as those using ferrite cores. Magnetic bubble memories have been developed in which very large numbers of bit information can be stored in small areas.

A block access memory such as is found in conventional fixed head disks can be designed using magnetic bubble memory chips. However, each chip in such a memory requires four driver or control circuits and a detector circuit to operate properly. Two driver circuits are needed to access the memory for the storage and retrieval of information. Two more are needed to generate information for storage in the chip memory and process information from the memory. A detector senses the binary value of information removed from the memory and provides an electronic equivalent which can be used by conventional circuits.

One problem in designing such memories is that the number of associated control drivers and detector circuits grows quite large as more magnetic bubble chips are employed. This places design restrictions on a memory system utilizing magnetic bubble chips because of the cost, power and space requirements imposed by the large number of these circuits when any sizable number of chips are employed in a memory organization.

One method of reducing the circuits associated with the plurality of chips in a memory is to arrange the chips in an array of rows and columns as suggested by Hsu Chang, "Bubble Domain Memory Chips", IEEE Transactions on Magnetics, Sept. 1972, pp. 564–569. There, two electronic drivers are required to control the transfer functions of the chips in each column and two electronic drivers and a sense amplifier are needed for the chips in each of the rows in the matrix organization.

SUMMARY OF THE INVENTION

Among the several objects of this invention may be noted the provision of matrixed magnetic bubble memory organizations in which the number of electronic driver and sensing circuits and sensing amplifiers is minimized, and the provision of such a matrix which uses little power, is low in cost, compact in size and highly reliable.

Briefly, a magnetic bubble memory organization of this invention comprises a plurality of magnetic bubble memory chips arranged in rows and columns to form a matrix. Each chip has a plurality of memory locations for storing magnetic bubbles; means for selectively transferring magnetic bubbles out of and into memory locations for the retrieval and storage of information; means for selectively replicating and annihilating magnetic bubble information transferred out of memory locations on the chip; means for selectively generating magnetic bubbles for storage in memory locations on the chip; and means for detecting the presence of magnetic bubbles transferred out of memory locations and for providing an electrical output signal in response to the detection thereof. Transfer electrical control signals are respectively commonly applied to the transfer means on all chips in each of the respective columns of the matrix for their simultaneous actuation. Replicate and annihilate electrical control signals are respectively commonly applied to the replication and annihilation means on all chips in each of the respective rows of the matrix for their simultaneous actuation. Generate control signals are respectively commonly applied to the generating means on all chips in each of the respective rows of the matrix for their simultaneous actuation. The movement of magnetic bubbles in all chips is synchronized. A single circuit commonly connecting the detecting means of each chip in the matrix conveys retrieved information out of the matrix. Thus, the memory locations of any magnetic bubble memory chip in the matrix may be selectively accessed for the storage and retrieval of information using a minimum number of supplied control signals for all of the chips in the matrix and only a single output circuit. A second embodiment of the invention employs a plurality of matrices arranged in a three dimensional array.

Other objects and features will be in part apparent and in part pointed out hereinafter.

BRIEF DESCRIPTION OF THE DRAWINGS

FIG. 4 is a trimetric schematically illustrating a three-dimensional magnetic bubble memory organization with matrices arrayed and interconnected in accordance with this invention.

Corresponding reference characters indicate corresponding parts throughout the several views of the drawings.

DESCRIPTION OF PREFERRED EMBODIMENTS

Figure 1:
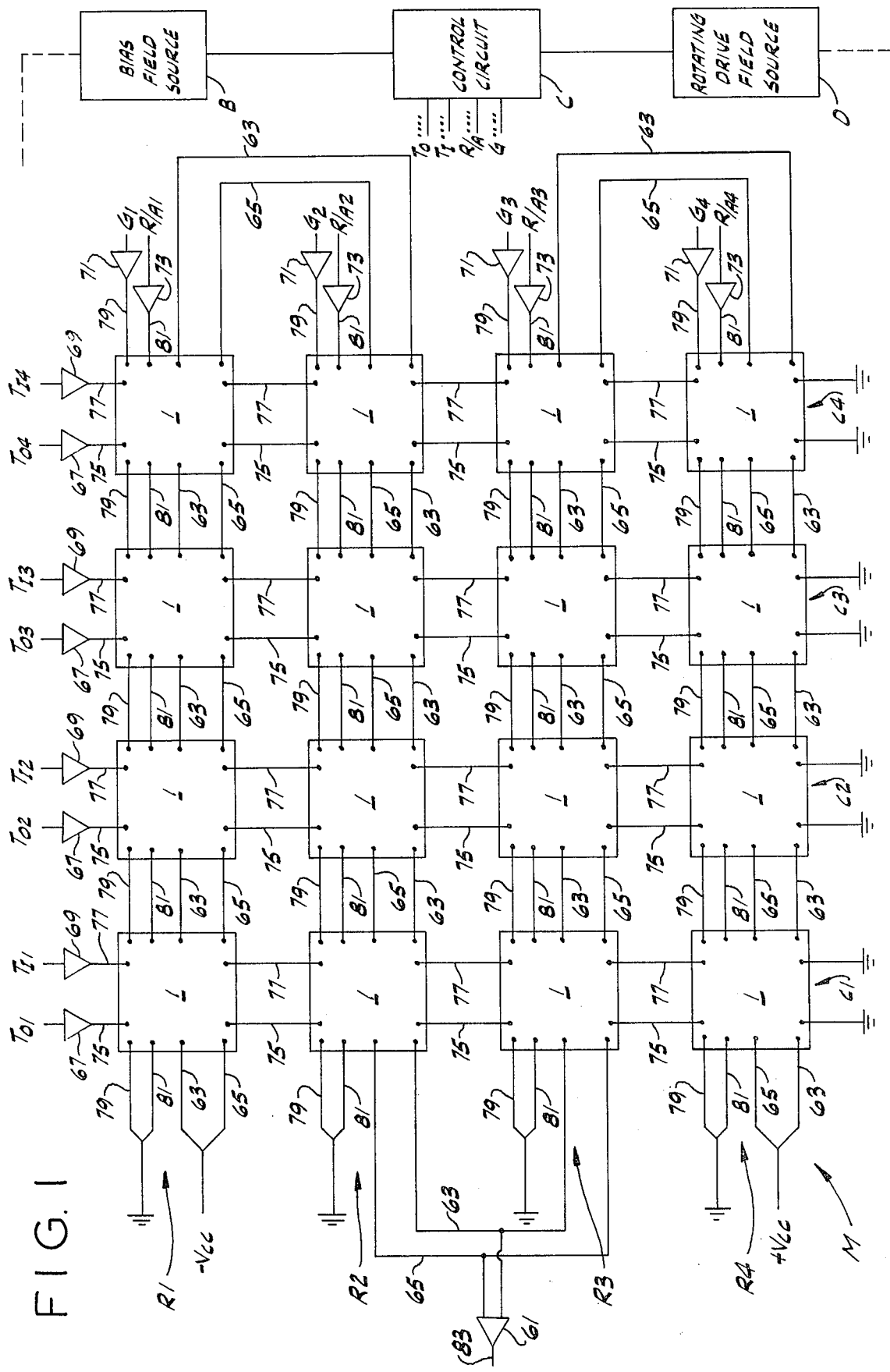
FIG. 1 schematically illustrates a magnetic bubble memory matrix of the present invention.

Referring now to the drawings and more particularly to FIG. 1, a magnetic bubble memory chip matrix of the present invention is indicated generally at M. This matrix is formed by arranging magnetic bubble chips 1 in rows and columns as shown. A bias field source B maintains the magnetic bubbles in all the chips 1 in the matrix at a desired size, while the rotating drive field source D generates an in-plane magnetic field for synchronously moving the magnetic bubbles in all the chips 1 of the matrix simultaneously. A control circuit C not only controls the drive field source D, but also the chip functions to be performed in a row or column of chips as will be described. The chip 1 interconnections and matrix M functional operation will further be described hereinafter.

Figure 2:
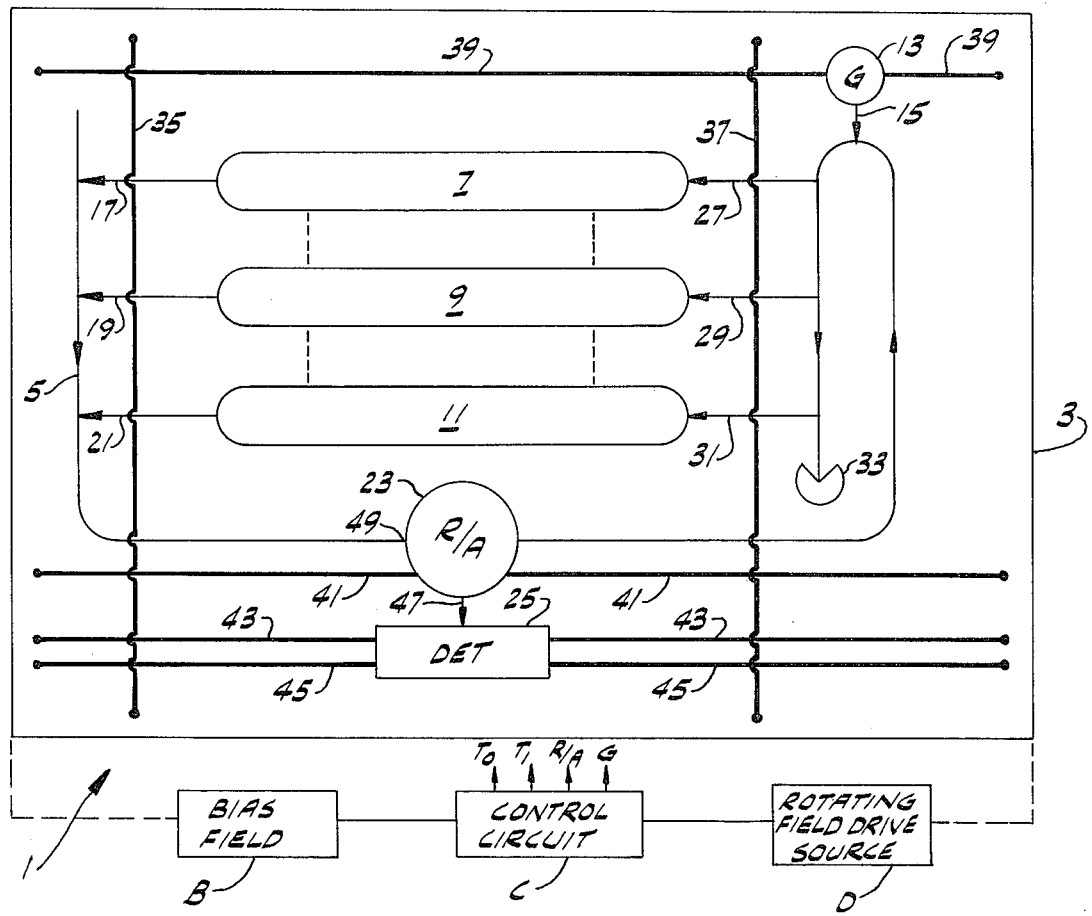
FIG. 2 is a representation of a magnetic bubble memory chip as used in a memory organization of the present invention.

FIG. 2 shows a magnetic bubble chip 1 of a type suitable for use in matrix M. Chip 1 comprises a suitable magnetic layer 3, such as epitaxial magnetic garnet film on a nonmagnetic garnet substrate, and has a shift register path 5, a number of memory storage loops of which three, 7, 9, and 11, are shown, one-way transfer gates 17, 19, 21, 27, 29 and 31, a magnetic bubble generator 13, a bubble annihilator 33, a replicate/annihilate gate 23, a magnetic bubble detector 25, detector output lines 43 and 45, and control lines 35, 37, 39, and 41 to which are respectively applied the $T_0$, $T_I$, R/A, and G outputs of control circuit C. Shift register path 5, memory storage loops 7, 9 and 11, generator 13, gate 23, and output paths 15 and 47 respectively are defined by any of the conventional means such as patterns of circuit elements of magnetically soft overlay material, e.g., alternating bar and T-shaped segments, etc., all as are well-known in the art.

Each memory loop 7, 9 and 11 has a number of bubble storage positions and these bubbles are propagated or circulated about the respective loops in a controlled manner by the rotating drive field. The one-way transfer gates, 17, 19, 21, 27, 29 and 31 are magnetic bubble devices, well-known in the art, which are selectively operable to permit the unidirectional movement of bubbles between path 5 and the loops.

Replicate/annihilate gate 23 performs two functions. When a first control signal is applied on control line 41 to the gate, any magnetic bubble in the gate will be destroyed. When a second control signal is applied to the gate, any magnetic bubble in the gate will be duplicated and both bubbles will be provided as outputs. Detector 25 includes a pair of resistive elements, one which is sensitive to the presence of a magnetic bubble to change its impedance, thus causing the detector output to change accordingly and indicate the sensing thereof.

Information is stored in memory loops 7, 9 and 11 by first clearing magnetic bubbles in the loop positions where the new information is to be stored and then generating new bubbles for insertion into those positions. This is all accomplished by appropriate output signals from control circuit C at appropriate times. When magnetic bubbles in loop 7, 9 and 11 pass one-way transfer gates 17, 19 and 21 respectively, control circuit C supplies an electrical control signal on its $T_o$ output which is applied on line 35 to simultaneously actuate the one-way transfer gates 17, 19 and 21. Magnetic bubbles are consequently transferred from their loop 7, 9 and 11 positions to shift register path 5. The bubbles move stepwise along path 5 to the input 49 of replicate/annihilate gate 23. Since the bubbles are not to be retained, control circuit C supplies an annihilate control signal at its R/A output which is applied on line 41 to gate 23, in response to which magnetic bubbles entering gate 23 are destroyed.

Control circuit C next supplies generate electrical control signals at its G output, which signals are applied to line 39 to actuate bubble generator 13 to produce magnetic bubbles representing new information to be stored. These bubbles move from generator 13 on path 15 to shift register path 5 and on path 5 sequentially past one-way input transfer gates 27, 29 and 31 of loops 7, 9 and 11 respectively. When control circuit C supplies an electrical control signal at its $T_I$ output, that signal is applied on control line 37 to simultaneously actuate gates 27, 29 and 31, and pass the bubbles from path 5 into loops 7, 9 and 11. Since control circuit C not only supplies the appropriate electrical control signals, but also controls the inplane rotating magnetic field source D, the movement of magnetic bubbles within chip 1 is synchronized with the application of the electrical signals to the appropriate chip control line throughout the sequences of operations, so that the newly stored information occupies the desired loop positions.

For retrieving information from loops 7, 9 and 11, magnetic bubbles are removed from their loop positions and moved to gate 23 in the manner previously discussed. Now, however, control circuit C supplies a replicate electrical control signal to be applied on line 41, and gate 23 in response thereto duplicates each magnetic bubble entering gate 23 at input 49. Of the pair of bubbles now in the gate, one exits the gate on path 5 and circulates therearound back past one-way input transfer gates 27, 29 and 31 of loops 7, 9 and 11 respectively. This bubble is transferred back into its original loop position in the manner previously discussed. The remaining bubble exits gate 23 on path 47 and is sensed by detector 25 which provides an equivalent electrical output signal on lines 43 and 45.

Figure 3:
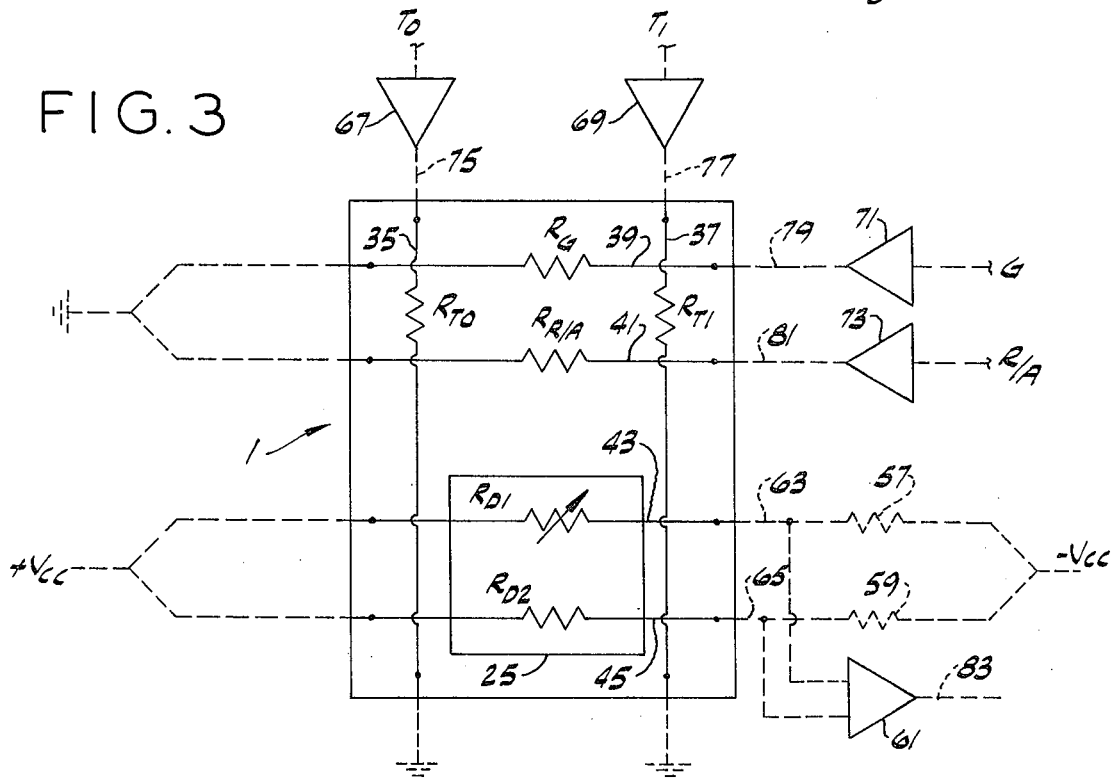
FIG. 3 is a circuit representation illustrating the control and sensing circuitry of the magnetic bubble memory chip of FIG. 1.

Referring now to FIG. 3, the control circuits for the functions performed on chip 1 are shown in schematic form. Each of the five chip controls, transfer-in, transfer-out, replicate/annihilate and generate, are shown in circuit form as including a driver 67, 69, 71 or 73 for supplying the control circuit C outputs, an electrical line 75, 77, 79 or 81 for bringing the driver output to the chip, the chip control lines 35, 37, 39 and 41, and a resistive element $R_{TO}$, $R_{TI}$, $R_{R/A}$ or $R_G$. The resistive elements $R_{TO}$, $R_{TI}$, $R_{R/A}$ and $R_G$ represent the current developing resistance of each respective control circuit necessary to create a current level sufficient to operate the appropriate chip control device. The driver elements 67 and 69 must develop sufficient voltage to create a current large enough to actuate all the output or input one-way transfer gates on the chip simultaneously. Driver element 73 must develop sufficient voltage to create a current level sufficient to perform the annihilation function performed by gate 23 when control circuit C supplies a first control signal, and to create a current level sufficient to replicate magnetic bubbles when circuit C supplies a second control signal. Driver element 71 must develop a sufficiently large voltage to permit a current level to be developed to generate magnetic bubbles in response to a control signal from circuit C.

As previously noted, detector 25 includes resistive elements $R_{D1}$, and $R_{D2}$. Two additional resistances 57 and 59 shown external to chip 1, represent the resistances in the detectors of other chips which, with elements $R_{D1}$ and $R_{D2}$, comprise a bridge circuit. A voltage is supplied to the bridge circuit to establish a reference output level across output lines 63 and 65 to an amplifier 61. When a magnetic bubble enters detector 25, magnetoresistive element $R_{D1}$ senses the bubble by a change in its resistive value and this change is reflected as a variation in the output level across lines 63 and 65, which level variation is amplified by the amplifier 61 and provided as an output on line 83.

It is to be noted that the operations performed on chip 1 depend upon the logical independence of the input and output transfer functions, the replicate and annihilate functions, and the generate functions. This means that operation of any magnetic bubble device on chip 1 is not triggered by the operation of any other bubble device. Rather, each functional element is actuated solely in response to the particular control signals supplied by circuit C at any given time. It will be understood that the structure of the chip 1 as illustrated and described herein is by way of example only. In this respect, the matrixed magnetic bubble memory as contemplated herein can be configured using any bubble chip type having at least two independent functions, such as the major-minor loop chip. This chip type uses a single column of two-way transfer gates rather than the two columns of one-way transfer gates as illustrated in FIG. 2.

Referring again to FIG. 1, it can now be seen that for matrix M the input and output transfer control lines on all the chips 1 in a column of the matrix are series interconnected, while the replicate/annihilate and generate control lines on all the chips 1 in a row are series interconnected. Further, all the detector output lines of all the chips in the matrix are series interconnected. Thus, lines 79 are used to interconnect all the bubble generator 13 control lines 39 for each row of chips 1. Lines 81 interconnect all replicate/annihilate gate 23 control lines 41 for each row of chips. The same thing is done for the columns of chips with lines 75 interconnecting all the output-transfer gate control lines 35 for each column of chips, while lines 77 interconnect all the input-transfer gate control lines 37 for all the chips 1 in a column. As previously noted, use of chips having a single column of two-way transfer gates in the matrix is also contemplated in which case only one set of lines 75 or 77 interconnecting the two-way transfer gate control lines for each column of chips would be required.

With all particular chip functions now series interconnected for a row or column of chips, any time a control signal is supplied by control circuit C though the respective driver for a row or column, all the appropriate bubble devices on all the chips in that respective row or column will be simultaneously actuated. Thus, for example, when an electrical control signal is supplied by driver $G_1$, all the bubble generators on the chips 1 in R1 will be simultaneously actuated and produce magnetic bubbles. Similarly, when an electrical control signal is supplied by driver $T_{01}$, all the output transfer gates on the chips 1 in C1 will be simultaneously actuated and magnetic bubbles will be transferred from their loop positions to the shift register path 5 on each chip.

The matrix M may be of any size consistent with the requirement that the drivers provide a signal sufficient to produce the current level necessary to actuate all the appropriate bubble devices on all the chips in the respective row or column simultaneously. The 4×4 matrix depicted in FIG. 1 is for illustrative purposes only. Further, it is to be understood that the simultaneous actuation of each chip function in a row or column could also be accomplished by parallel connecting the driver circuit output to the control lines on each chip in a respective row or column.

The detector output for each chip 1 instead of being series connected for each row or column is instead series interconnected for the entire matrix of chips by series interconnecting all the chip 1 output lines 43 and 45 with lines 63 and 65. This is possible, because as will be discussed, an output will be provided only by one chip within matrix M at any given time. Thus, besides reducing the number of control circuits required for a large number of chips, the number of output circuits required can be reduced to one.

The operations performed by matrix M correspond to those performed by a single chip. If, for example, it is desired to store new information in the memory loops of the chip 1 at R2,C2, first a control signal is supplied by control circuit C through driver $T_{02}$ to all the output transfer gates on all the chips 1 in C2 of the matrix. Because of the series interconnections of the control lines 35 of the chips 1 in C2, the control signal is commonly applied to all the output transfer gates on the chips in the column and all are simultaneously actuated, thereby transferring magnetic bubbles from their loop positions on each chip to the shift register path 5 on each chip 1 in the column. When the magnetic bubbles enter gate 23 on each chip in C2, control circuit C supplies an annihilate control signal through driver $R/A_2$ to all the gates 23 on all the chips 1 in R2. Because of the series interconnections of the control lines 41 of the chips 1 in R2, the control signal is commonly applied to the replicate/annihilate gate 23 of each chip and all are simultaneously actuated. The magnetic bubbles in gate 23 of the chip at the R2,C2 intersection are destroyed. However, since no annihilate signal is applied to the gate 23 of any other chip in C2, none of the magnetic bubbles passing through these gates are destroyed. Further, even though the gates 23 of the other chips in R2 are actuated, no magnetic bubbles are in these gates and nothing is destroyed.

Control circuit C next supplies a generate control signal through driver $G_2$ to simultaneously actuate the bubble generators 13 on each chip in its row. New magnetic bubbles are now produced in each chip in the row and travel along the shift register path 5 of each chip in the row past the input one-way transfer gates for the memory loops. Control circuit C then supplies an electrical control signal through driver $T_{i2}$ to all the input transfer gates on all the chips 1 in C2 and these are simultaneously actuated. The magnetic bubbles newly generated in the chip 1 at the R2,C2 intersection are transferred from the chip's shift register path 5 into the loop positions previously occupied by the now destroyed bubbles. Similarly, the magnetic bubbles on the shift register paths 5 on the other chips 1 in C2 are transferred back into their original loop positions. However, since none of the other input transfer gates on the chips 1 in R2 are actuated, the newly generated bubbles on the shift register paths 5 of those chips continue to the end of those paths and are destroyed by the annihilator 33 positioned at the end of each.

To retrieve information from any chip in the matrix, for example the chip 1 in R2,C2, magnetic bubbles are transferred from their loop positions to the shift register path 5 on each chip 1 in C2 in the manner previously discussed, and moved along path 5 to their respective gates 23. Control circuit C now supplies a replicate control signal through driver $R/A_2$ which is commonly applied to the control lines 41 on each chip 1 in R2. On the chip 1 at the R2,C2 intersection, this signal causes magnetic bubbles in gate 23 to be duplicated. However, since none of the other gates 23 of the chips 1 in C2 are actuated, nothing is duplicated. Also, even though the other gates 23 of the chips 1 in R2 are actuated, no bubbles pass through these gates, and therefore nothing is replicated.

The bubbles on the shift register path 5 of the chips 1 in C2, including one of the pair of bubbles in chip 1 at the R2,C2 intersection continue along the path 5 back past the input one-way gates of the memory loops on each chip and are returned to their original positions in those loops in the manner previously discussed. The second bubble in gate 23 of the chip 1 at the R2,C2 intersection exits gate 23 on path 47 and is sensed by the detector 25 of the chip. The variation in output level of detector 25 resulting from the presence of the bubble is conveyed on output lines 63 and 65, which are common to all the chip detectors in the matrix, to amplifier 61 which enhances the detected output signal and provides it as the matrix M output on line 83. Since only one chip in the entire matrix will have a detector 25 output at any given time, there is no possibility that the matrix output will be a mix of two detected output signals which could cause an erroneous matrix output.

FIG. 4 shows a second matrix organization M' in which a plurality of matrices MA, MB, MC and MD are employed to further increase the information storage capacity of the system without significantly increasing the number of control and output circuits required with a single matrix. Here, matrices MA, MB, MC, and MD are arranged substantially in parallel and generally in registry with each other. This is done so that the bias field source B and rotating field drive source D can present substantially similar fields to all chips 1 in organization M'. Each of these matrices is similar to and operates in the same manner as discussed with reference to FIG. 1. The increased memory capacity without a corresponding increase in control circuit C drivers is accomplished by connecting in parallel the driver output for each function for a corresponding respective row or column of chips in each matrix. Thus, for example, all the series connected control circuits for the input-transfer gates of the chips 1 in C1 of each matrix MA-MD are connected in parallel to the output of the control driver $T_{f1}$ of control circuit C. The output-transfer control circuits for corresponding respective columns and the replicate/annihilate control circuit for the corresponding respective rows are similarly interconnected. However, the generate control circuits are still only commonly interconnected for all the chips of each row of each matrix so that different information may be stored in corresponding chips of separate matrices. Similarly, each matrix MA-MD also has its own detector output circuit common only to all the chips of each matrix. It is to be noted that for the purposes of clarity the detector output circuit 63 and 65, and amplifier 61 arrangement are depicted somewhat differently in FIG. 4 from that shown in FIG. 1. However, the interconnections between the chips 1 of each matrix provide the same function as described above in regard to FIG. 1. Also, the structure of the chips 1 of each matrix shown in FIG. 4 may take other forms of bubble chip types having at least two independent functions as noted in discussing FIGS. 1 and 2.

Any number of matrices M may be employed in an organization M' provided that the capabilities of the drivers in circuit C are such that they will develop a current level sufficient to actuate all the respective chip bubble devices simultaneously.

In view of the above it will be seen that the several objects of this invention are achieved and advantageous results attained.

As various changes could be made in the above constructions without departing from the scope of the invention, it is intended that matter contained in the above description shall be interpreted as illustrative and not in a limiting sense.

What is claimed is:

1. A magnetic bubble memory organization, comprising:
    a plurality of magnetic bubble memory chips arranged in rows and columns to form a matrix, each chip having:
        a plurality of memory locations for storing magnetic bubbles;
        means for selectively transferring magnetic bubbles out of and into said memory locations for the retrieval and storage of information;
        means for selectively replicating and annihilating magnetic bubble information transferred out of memory locations on said chip,
        means for selectively generating magnetic bubbles for storage in memory locations on said chip, and
        means for detecting the presence of magnetic bubbles transferred out of memory locations and for providing an electrical output signal in response to the detection thereof,
    means for supplying transfer electrical control signals to be respectively commonly applied to the transfer means on all chips in each of the respective columns of the matrix for the simultaneous actuation thereof;
    means for supplying replicate and annihilate electrical control signals to be respectively commonly applied to the replication and annihilation means on all chips in each of the respective rows of the matrix for the simultaneous actuation thereof;
    means for supplying generate control signals to be respectively commonly applied to the generating means on all chips in each of the respective rows of the matrix for the simultaneous actuation thereof;
    means for synchronizing the movement of magnetic bubbles in all the chips; and
    a single circuit commonly connecting the detecting means of each chip in the matrix for conveying retrieved information out of said matrix whereby the memory locations of any magnetic bubble memory chip in the matrix may be selectively accessed for the storage and retrieval of information using a minimum number of control signal supplying means for all the chips in the matrix and only a single output circuit.

2. A memory organization as set forth in claim 1 wherein said transfer means on all chips in a respective column are commonly interconnected to form respective series circuits thereby allowing the common application of control signals thereto for the simultaneous actuation thereof.

3. A memory organization as set forth in claim 2 wherein said replication and annihilation means on all chips in a respective row are commonly interconnected to form respective series circuits thereby allowing the common application of control signals thereto for the simultaneous actuation thereof, and said generating means on all chips in a respective row are commonly interconnected to form respective series circuits thereby allowing the common application of control signals thereto for the simultaneous actuation thereof.

4. A memory organization as set forth in claim 3 wherein the means on each chip for replication and annihilation are constituted by the same component which selectively provides these two functions.

5. A memory organization as set forth in claim 1 further including amplification means connected to the single output circuit to provide a signal of increased magnitude indicative of the information being retrieved from the matrix.

6. A memory organization as set forth in claim 1 wherein the detection means on each chip in the matrix includes a magnetoresistive element, these elements for all chips in the matrix being commonly connected by the single output circuit to form a bridge network whereby the sensing of a magnetic bubble by any said element on any chip in the matrix will cause a variation in the bridge output.

7. A magnetic bubble memory organization comprising:
   a plurality of magnetic bubble memory matrices, each matrix comprising a plurality of magnetic bubble memory chips arranged in rows and columns, each chip having:
      a plurality of memory locations for storing magnetic bubbles,
      means for selectively transferring magnetic bubbles out of and into said memory locations for the retrieval and storage of information,
      means for selectively replicating and annihilating magnetic bubble information transferred out of memory locations on said chip,
      means for selectively generating magnetic bubbles for storage in memory locations on said chip, and
      means for detecting the presence of magnetic bubbles transferred out of memory locations and for providing an electrical output signal in response to the detection thereof,
   means for supplying transfer electrical control signals to be respectively commonly applied to the transfer means on all chips in each of the corresponding respective columns of the matrices for the simultaneous actuation thereof;
   means for supplying replicate and annihilate electrical control signals to be respectively commonly applied to the replication and annihilation means on all chips in each of the corresponding respective rows of the matrices for the simultaneous actuation thereof;
   means for supplying generate control signals to be respectively commonly applied to the generating means on all chips in each respective row of each of the matrices;
   means for synchronizing the movement of magnetic bubbles in all the chips; and
   a single circuit in each respective matrix commonly connecting the detecting means of each chip in said respective matrix for conveying retrieved information out of each said matrix whereby the memory locations of any magnetic bubble memory chip in any of the matrices may be selectively accessed for the storage and retrieval of information using a minimum number of control signal supplying means for all the chips in the matrices and only a single output circuit for each matrix.

8. A memory organization as set forth in claim 7 wherein said transfer means on all chips in a respective column of a matrix are commonly interconnected to form a series circuit and the series circuits for corresponding respective columns of the matrices are commonly interconnected to form parallel circuits thereby allowing the common application of congtrol signals thereto for the simultaneous actuation thereof.

9. A memory organization as set forth in claim 8 wherein the replication and annihilation means on all chips in a respective row of a matrix are commonly interconnected to form a series circuit and the series circuits for corresponding respective rows of the matrices are commonly interconnected to form parallel circuits thereby allowing the common application of control signals thereto for the simultaneous actuation thereof.

10. A memory organization as set forth in claim 9 wherein the generating means on all chips in each respective row of each matrix are commonly interconnected to form a series circuit thereby allowing the common application of control signals thereto for the simultaneous actuation thereof.

11. A memory organization as set forth in claim 10 wherein the means on each chip for replication and annihilation are constituted by the same component which selectively provides these two functions.

12. A memory organization as set forth in claim 7 wherein the chips in each matrix are arranged in a substantially planar array, each matrix being disposed in a different plane substantially parallel to the respective planes in which the other matrices are disposed, and said matrices being arranged generally in registry in stacked relationship.

13. A memory organization as set forth in claim 7 which further includes respective amplification means connected to the single output circuit of each matrix to provide a signal of increased magnitude indicative of the information being retrieved from each matrix.

14. A memory organization as set forth in claim 7 wherein the detection means on each chip in a respective matrix includes a magnetoresistive element, these elements for all chips in said matrix being commonly connected by the single output circuit for the respective matrix to form a bridge network whereby the sensing of a magnetic bubble by any said element on any chip in said matrix will cause a variation in the bridge output.

* * * * *